United States Patent
Iwata et al.

[11] Patent Number: 6,144,217
[45] Date of Patent: Nov. 7, 2000

[54] LOW SWITCHING NOISE LOGIC CIRCUIT

[75] Inventors: Atsushi Iwata, Higashihiroshima; Makoto Nagata, Hiroshima; Katsumasa Hijikata, Takatsuki, all of Japan

[73] Assignee: Semiconductor Technology Academic Research Center, Tokyo, Japan

[21] Appl. No.: 09/348,584

[22] Filed: Jul. 7, 1999

[30] Foreign Application Priority Data

Jul. 17, 1998 [JP] Japan .................................. 10-203523

[51] Int. Cl.⁷ ...................................................... H03K 17/16
[52] U.S. Cl. .............................................. 326/27; 326/26
[58] Field of Search ................... 326/27, 26, 82, 326/83, 86, 87

[56] References Cited

U.S. PATENT DOCUMENTS

| | | |
|---|---|---|
| 4,754,170 | 6/1988 | Toda et al. ................................ 326/27 |
| 4,783,603 | 11/1988 | Goforth et al. . |
| 5,021,685 | 6/1991 | Kihara . |
| 5,198,699 | 3/1993 | Hashimoto et al. . |

FOREIGN PATENT DOCUMENTS 0 255 168  2/1988  European Pat. Off. .
197 00 988  7/1997  Germany .
3-030191  2/1991  Japan .

OTHER PUBLICATIONS

"Determination of Optimum On–Chip Bypass Capacitor in CMOS VLSI Systems to Reduce Switching Noise", by Kanigicherla, et al., Proceedings of the 1997 IEEE International Symposium on Circuits and Systems: Circuits and Systems in the Information Age, vol. 3, Jun. 9, 1997, pp. 1724–1727.

"Analog Logic Techniques Steer Around the Noise", by Allstot, et al., IEEE Circuits and Devices Magazine, vol. 9, No. 5, Sep. 1, 1993, pp. 18–21.

"Analog Logic Techniques Steer Around the Noise", by Allstot et al., IEEE Circuits & Devices, vol. 9, No. 9, Sep. 1993, pp. 18–21.

*Primary Examiner*—Tan T. Nguyen
*Attorney, Agent, or Firm*—McDermott, Will & Emery

[57] ABSTRACT

An analog-digital hybrid IC device for reducing cross-talk adds an electrostatic capacitance element to the power supply side and/or the ground side of a CMOS logic circuit forming the digital circuit part, connects a resistance between the electrostatic capacitance element and the terminal to which the electrostatic capacitance element was added, and buffers charging and discharging when the logic elements switch on and off to reduce noise produced by current peaks.

12 Claims, 21 Drawing Sheets

※On-resistance of m2

※C=C1+CL
※Equivalent resistance of m1

※ ---- indicates conventional CMOS logic ckt.

Capacitance of Load as whole circuit is about 0.15pF

SCL with both side arrangement

SCL with ground side arrangement

SCL with both side arrangement

SCL with PS side arrangement

SCDL with both side arrangement

SCDL with ground side arrangement

SCDL with both side arrangement

SCDL with PS side arrangement

LOW SWITCHING NOISE LOGIC CIRCUIT

BACKGROUND OF THE INVENTION

1. Field of the Invention

The present invention relates to a CMOS logic circuit comprising on the same substrate p-channel and n-channel MOS transistors in a logic circuit configuration and, more particularly, to an analog-digital hybrid IC device comprising a CMOS logic circuit and an analog circuit on the same substrate.

2. Description of Related Art

Digital computers can be built using only digital circuitry, but multimedia information systems and human interface systems in which graphic and audio information is dealt with must be able to handle not only digital signals, but also analog signals. This has made it necessary to construct devices using both analog circuits and digital circuits.

In a conventional CMOS logic circuit, an applied input signal causes a transistor or other circuit element to become either conducting or non-conducting to produce a particular output signal. During this operation, charging and discharging the parasitic electrostatic capacitance of the circuit causes a transient current to be drawn from the power source and flow out through the ground. As this transient current flows through resistance and impedance elements on the power supply line, it produces a switching noise. This switching noise occurs particularly in digital circuits and, in a typical analog-digital hybrid IC device as shown in FIG. 1, leaks from the digital circuit to the analog circuit side through wiring and the IC substrate. This noise has a limiting effect on the dynamic range and S/N ratio of the analog circuit. It is therefore not possible to achieve a high precision analog circuit.

The mechanism whereby noise is generated in a CMOS logic circuit will be discussed with reference to an inverter shown in FIG. 2. It should be noted that the operation of any common CMOS gate can be generally described with reference to the inverter.

A typical IC device normally has a sheet resistance of 50 mΩ/$\mu$m2 on the power supply and ground lines. For example, a line, 10 $\mu$m wide and 1 mm long, has a 5 Ω sheet resistance. In the example shown in FIG. 2, Rps and RG are wiring resistances on the power supply and ground lines. The wiring capacitance and input gate capacitance of the next element are also connected to the output of each gate as load capacitance CL. FIG. 2 is a model circuit diagram of this arrangement. When a pulse is applied to this circuit, a charge/discharge current flows to CL. When the charge current flows, ground line resistance RG produces a voltage boost at a node Q in FIG. 2. This results in an up spike in the ground potential as shown in FIG. 3. A charge current likewise produces a down spike in the line potential at a node P.

In a typical n-well CMOS IC device, switching noise is inserted to the p-substrate because node Q is an NMOS source and is connected to the substrate. In a typical IC, the substrates are used in common by the digital circuit and analog circuit parts, which are thus electrically connected, and are therefore a major factor in the leakage of switching noise from the digital part to the analog circuit part. Furthermore, if the power supply and ground lines are also shared with the analog circuit part, the aluminum lines are another factor in switching noise leakage to the analog circuit part.

One method known in the art for reducing noise in a CMOS logic circuit is to use wiring lines to connect substrate contacts as shown in FIG. 4. Referring to FIG. 4 which illustrates a typical circuit diagram for this configuration, there are two power supply and ground lines in this case; one for circuit drive and one for connection to the substrate. Unlike in the conventional CMOS logic circuit, the circuit is not connected to the substrate at the node Q, and noise at the node Q is therefore not inserted to the substrate. Substrate noise does occur in this device as described below.

As indicated by the dotted lines in FIG. 4, parasitic capacitances Cgb (between the gate and substrate) and Cdb (between the drain and substrate) are present at the MOS transistors. If we consider the paths from a node I to the ground GND2 through a node X and from the junction O to the ground GND2 through the node X in FIG. 4, an RC differential circuit is formed and the potential at the node I (input) or O (output) varies considerably according to the input/output pulse. This produces a differential waveform, which appears as substrate noise, at the node X (p-substrate). This noise is normally amplified by parasitic impedance and oscillates (FIG. 16 (b)).

Current steering logic (CSL) circuits are known in the art as basic logic circuits suitable for noise reduction. The CSL circuits, however, do not use CMOS logic circuits in the form as they are and, instead, require that the logic circuit be designed as a CSL circuit and, in this sense, these types of the CSL circuits are not directly related to the intent of the present invention. (See, for example, David J. Allstot et al., "Analog Logic Techniques Steering Around the Noise", IEEE Circuits & Devices, Vol. 9, No. 9, September 1993, pp. 18–21.)

SUMMARY OF THE INVENTION

An object of the present invention is therefore to reduce switching noises in a CMOS logic circuit to thereby reduce cross-talk noise in an analog-digital hybrid IC device, so that the analog circuit can have an increased performance.

To achieve this object, the present invention adds a capacitive element to at least one of the power supply side and the ground side of the standard CMOS logic circuit so that transient current during switching operations either flows in from this capacitive element or is discharged from this capacitive element, and transient currents thus do not appear outside the logic circuit. Charging and discharging this added capacitive element is accomplished slowly by connecting a MOS transistor with a resistive component or a resistor between the added capacitive element and the external power source or ground. Because it is possible to decrease the peak value of transient currents flowing from the external power source or to the ground, it is possible to suppress the peak value of the switching noise occurring at a resistance or impedance on the power supply line.

Logic amplitude can be decreased, and power consumption can therefore be decreased, if the above-described circuit is so designed that a voltage on a capacitive element on the ground side does not return to the ground potential, and a voltage on a capacitive element on the power source side thus does not return to the external supply voltage circuit.

More specifically, one or both of a p-channel MOS transistor having its gate connected with the drain and an n-channel MOS transistor having its gate connected with the drain is inserted between the external power source and the power supply terminal of the conventional CMOS logic circuit, and the added capacitive element is connected to the drain terminal of the or each inserted transistor. Transient current is thus prevented from appearing outside the logic circuit by designing the transient current during switching operations to flow in or discharge from this added capacitive element.

Moreover, supply or discharge of the current to or from this added electrostatic capacitance is preferably accomplished by the inserted MOS transistor. This reduces the peak value of transient currents when switching occurs, and thus makes it possible to suppress the switching noise at resistance and impedance elements on the power supply line. Power consumption can also be reduced because the logic amplitude is decreased an amount equivalent to the threshold voltage of the inserted MOS transistor.

Other objects and attainments together with a fuller understanding of the invention will become apparent and appreciated by referring to the following description and claims taken in conjunction with the accompanying drawings.

DESCRIPTION OF THE PREFERRED EMBODIMENTS

The preferred embodiments of the present invention are described below with reference to the accompanying figures.

Noise Evaluation Method

Before proceeding with the detailed description of preferred embodiments, the method used for evaluating noise is described. There are basically two types of noise evaluation methods:

1. noise voltage peak evaluation, and
2. noise power evaluation.

Note that the noise power is proportional to the time integral of the square of the noise voltage. It is hard to say which method is better as a general test method. For example, if the analog circuit affected by noise is a comparator or sampling circuit, the noise peak method is effective, but the noise power method is better for amplifiers and other common analog circuits. Both methods are therefore used below to evaluate noise in the present invention.

Embodiment 1
Low Switching Noise CMOS Logic Circuit: SCL

Figure 1:
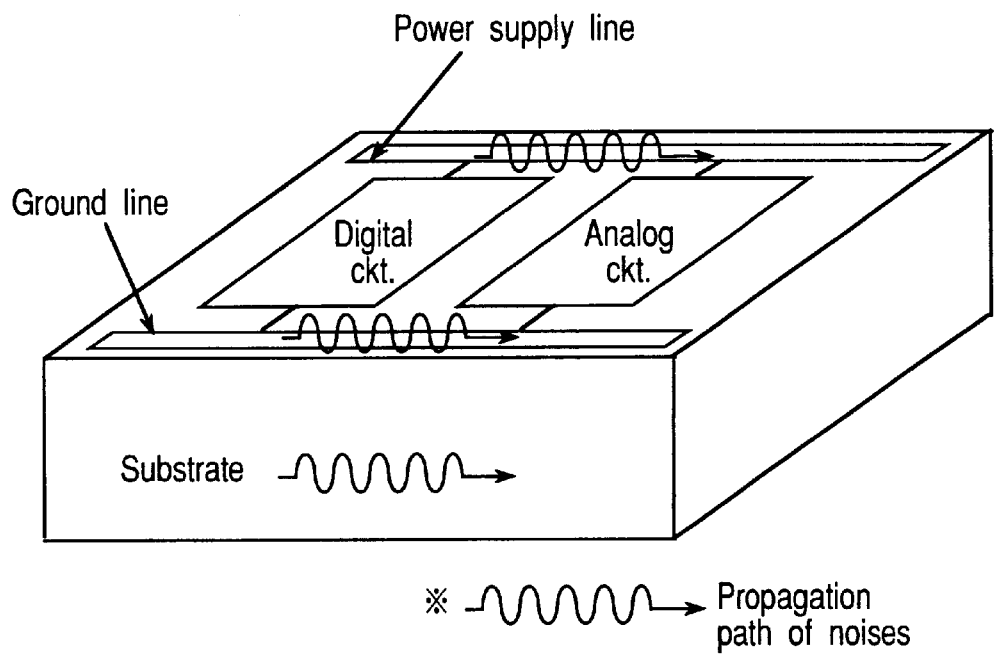
FIG. 1 is a schematic perspective view of the conventional hybrid analog-digital LSI circuit, showing how noises propagate in the circuit.
Figure 2:
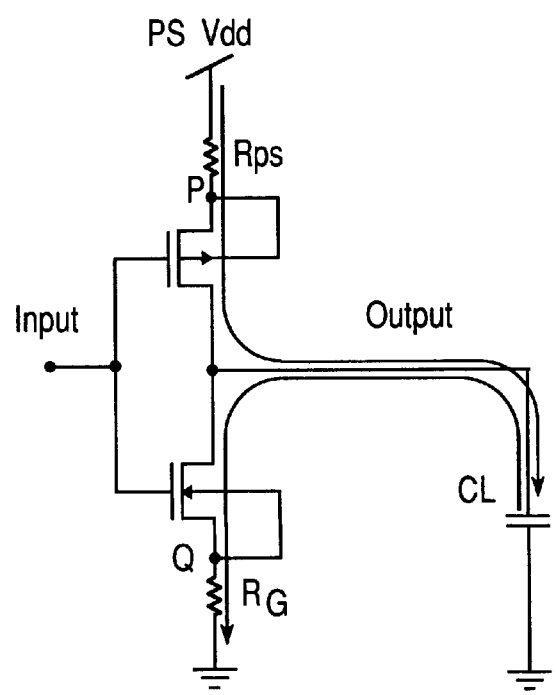
FIG. 2 is a CMOS logic circuit, showing how noises are generated in the circuit.
Figure 3A:
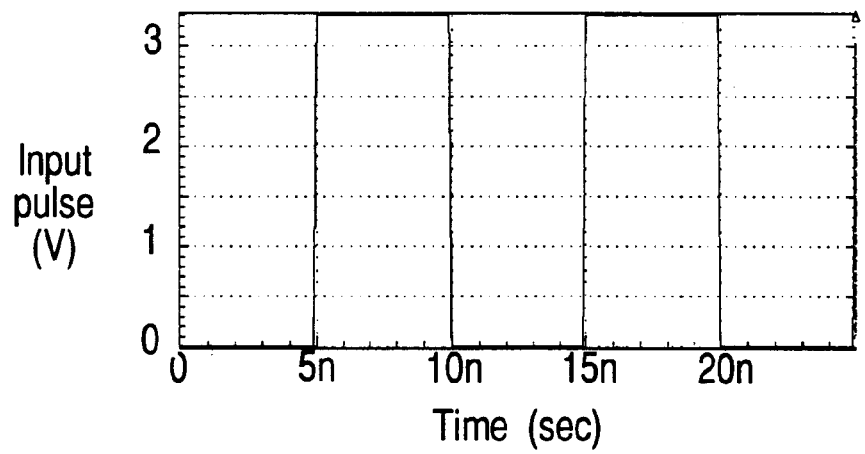
FIGS. 3A and 3B illustrate waveforms of noises in a CMOS logic circuit.
Figure 3B:
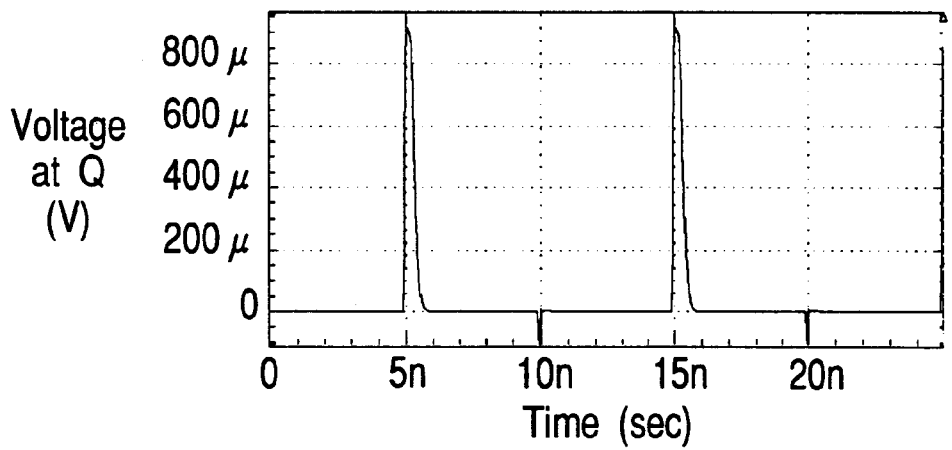
Figure 4:
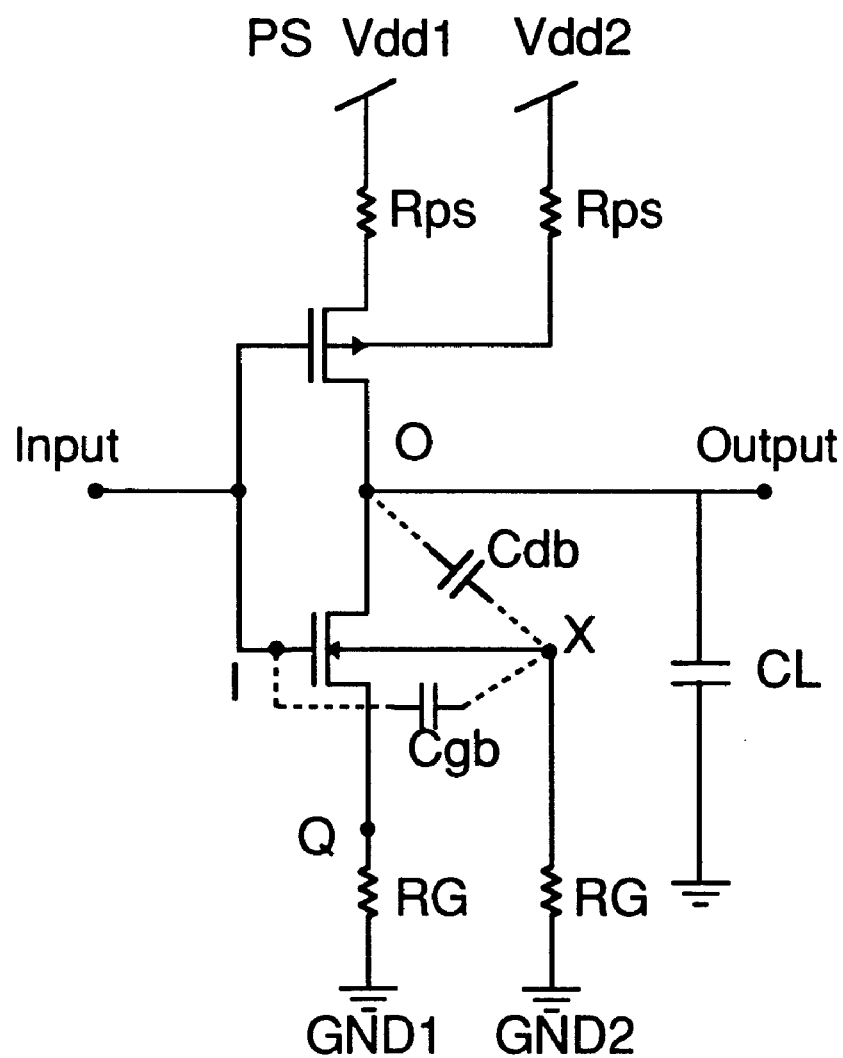
FIG. 4 is a circuit diagram of a CMOS logic circuit having exclusive lines for well and substrate contacts.
Figure 5:
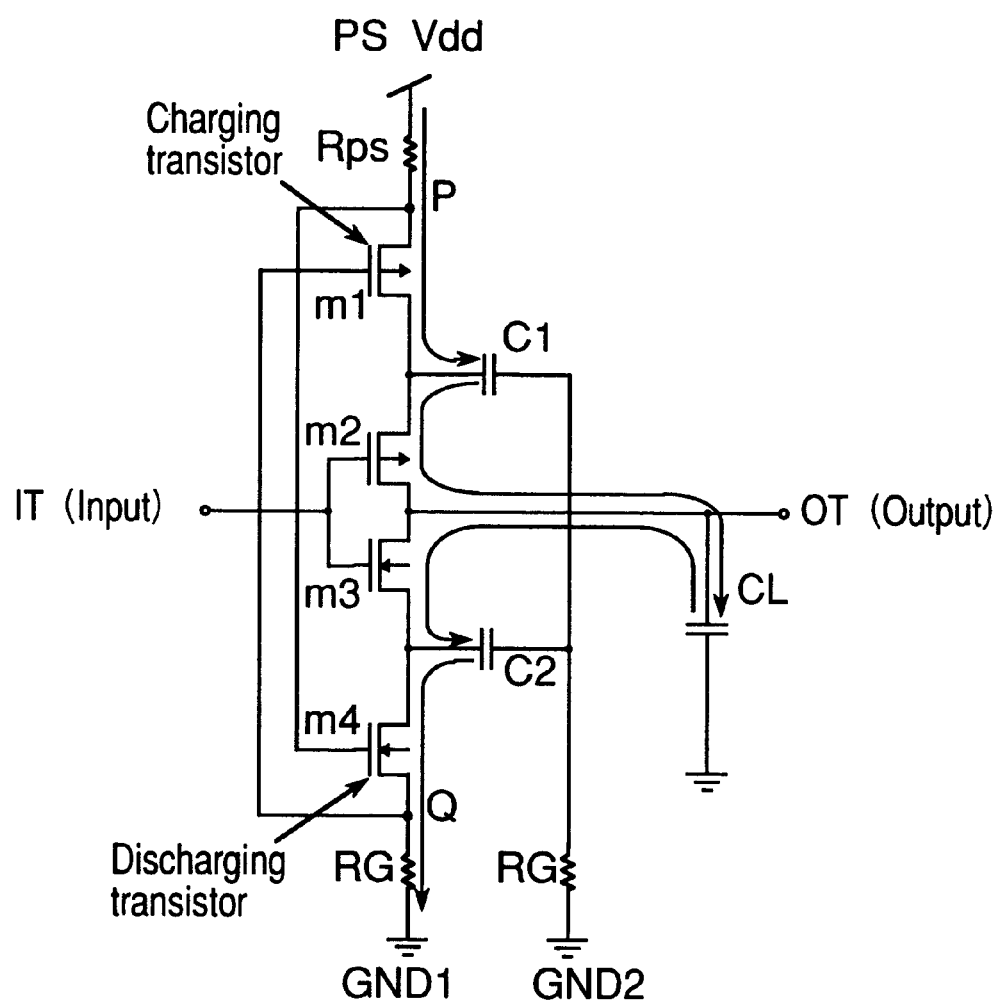
FIG. 5 is a circuit diagram of an SCL inverter according to the present invention.

FIG. 5 is a circuit diagram of a slowly charging logic (SCL) inverter according to this preferred embodiment of the present invention. As shown in FIG. 5, a p-channel MOS transistor m1 is inserted on the power supply Vdd side, and an n-channel MOS transistor m4 is inserted on the ground GND1 side, of p-channel and n-channel MOS transistors m2 and m3 forming an inverter interposed between power supply Vdd and ground GND1. The inserted p-channel MOS transistor m1 is used for charging, and has a capacitor C1 connected between the drain and ground GND2. The n-channel MOS transistor m4 inserted to ground GND1 is for discharging, and likewise has a capacitor C2 connected between its drain and ground GND2.

Desirably, transistor m1 has a ratio (W/L) of channel width (W) to channel length (L) equal to or less than that of transistor m2 and transistor m4 has the ratio (W/L) equal to or less than that of transistor m3. Thus, the insertion of transistors m1 and m4 indicates insertion of resistance components equal to or larger than those formed by transistors m2 and m3, respectively.

It should be noted that in FIG. 5 reference character Rps represents a wiring resistance on the power supply side, reference character RG represents a ground wiring resistance, and reference character CL represents a load capacitance on the output terminal OT side.

As will be understood from the following description, the capacitance of each of capacitor C1 and capacitor C2 is chosen to be sufficiently high relative to the load capacitance.

Figure 6A:
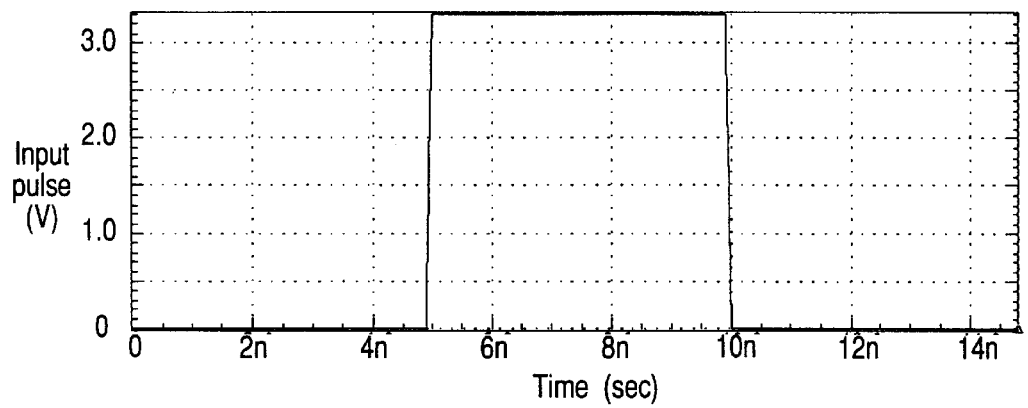
FIGS. 6A and 6B are graphs of the noise reduction effect of the SCL inverter shown in FIG. 5.
Figure 6B:
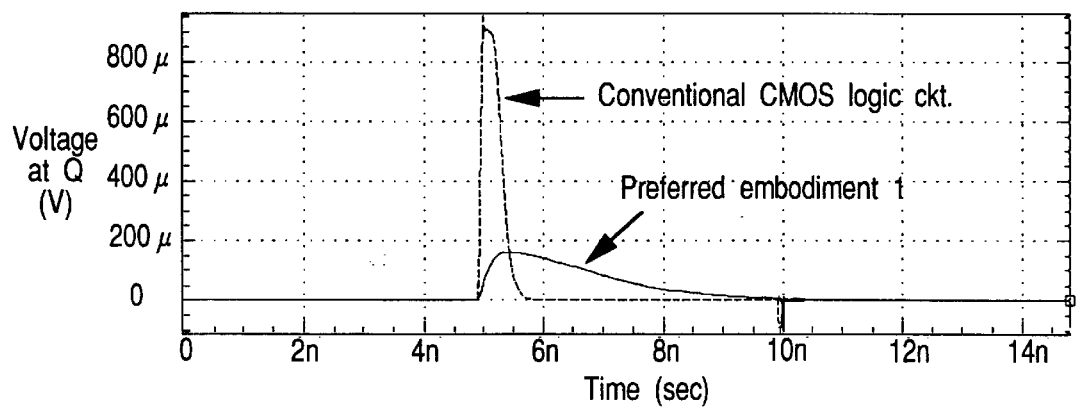

When the circuit shown in FIG. 5 outputs high, a positive charge is supplied from an added capacitor C1 to a load capacitance CL, and not from power supply Vdd, and the charge lost by capacitor C1 is charged slowly from the power supply with a large time constant. When the circuit outputs low, the charge accumulated to the load capacitance CL is moved temporarily to capacitor C2, and the charge accumulated to capacitor C2 is slowly discharged to ground GND1 with a large time constant. As a result, there is little transient current flowing to the power supply line and ground line, and switching noise can be reduced as shown in FIG. 6.

The operation of an SCL inverter will now be described more specifically with reference to FIG. 7.

Figure 7A:
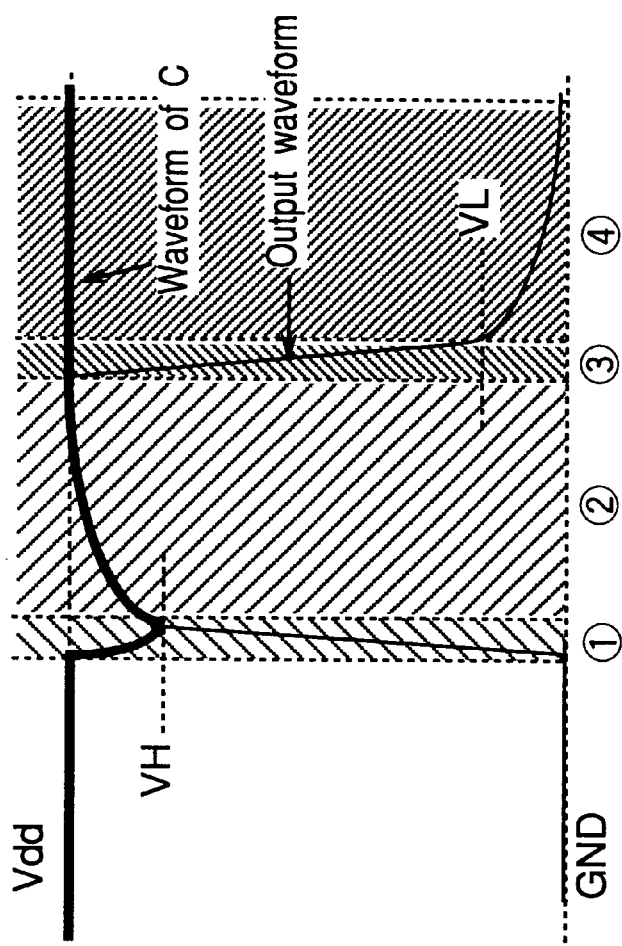
FIG. 7A shows the operating modes of the SCL inverter shown in FIG. 5.
Figure 7B:
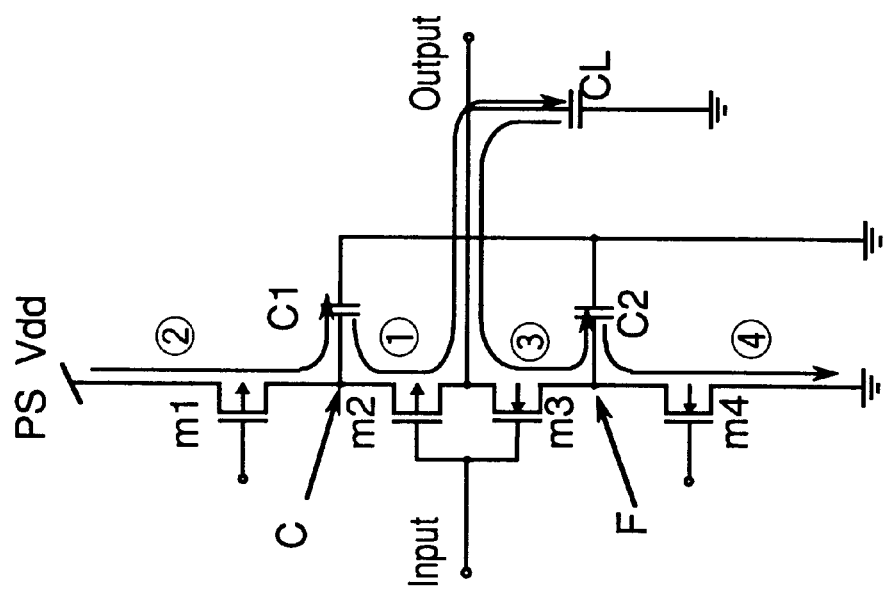
FIG. 7B shows the output waveform in each operating mode.

As indicated by (1) to (4) in FIG. 7A, this SCL inverter has four operating modes. As indicated by an output waveform in FIG. 7B, the operating mode (1) is the mode in which an applied input signal turns p-channel MOS transistor m2 on, the charge accumulated to capacitor C1 moves to the load capacitance CL, and the output potential rises to the same potential as that at node C. This potential VH can be determined by the simple calculation shown in equation 1.

$$VH = \frac{C1}{C1+CL}Vdd \quad (1)$$

The operating mode (2) is the mode in which the charge lost by capacitor C1 is recharged from the power supply Vdd, and the output potential rises slowly from VH to Vdd.

If C1>>CL, the time constant in this mode is determined by on-resistance R1 of transistor m1 and C1. In this case, it is desirable to design transistors m1 and m2 to have a ratio (W/L) substantially equal to each other.

On the other hands, if R1>>R2(on-resistance of transistor m2), the time constant is determined by R1 and (C1+CL). In this case, it is desirable to design the ratio (W/L) of transistor m1 is equal to or less than one tenth of that of transistor m2 and C1 is equal to CL.

The operating mode (3) is the mode in which p-channel MOS transistor m2 is off and n-channel MOS transistor m3 is on, the charge in load capacitance CL moves to capacitor C2, and the output potential drops to the same potential as at the node F. This potential VL can be determined from equation 2.

$$VL = \frac{CL}{C2+CL}Vdd \quad (2)$$

The operating mode (4) is the mode in which the charge accumulated to capacitor C2 is discharged to the ground, and the output drops slowly from VL to 0 V.

If C2>>CL, the time constant in this mode is determined by on-resistance R4 of transistor m4 and C2. In this case, it is desirable to design transistors m3 and m4 to have a ratio (W/L) substantially equal to each other.

On the other hands, if R4>>R3, the time constant is determined by R4 and (C2+CL). In this case, it is desirable to design the ratio (W/L) of transistor m4 is equal to or less than one tenth of that of transistor m3 and C2 is equal to CL.

It is therefore possible to suppress impedance-induced noise by reducing the peak value of the transient current flowing from the power supply to ground.

Operating Speed Evaluation

To evaluate SCL operating speed, the time-constant at the rise in $$\frac{q1}{C1} = i \cdot R2 + Vout \quad (3)$$

$$Vout = \frac{qL}{CL}$$

$$i = \frac{dqL}{dt}$$

$$q1 = qL = C1 \cdot Vdd$$

Figure 8:
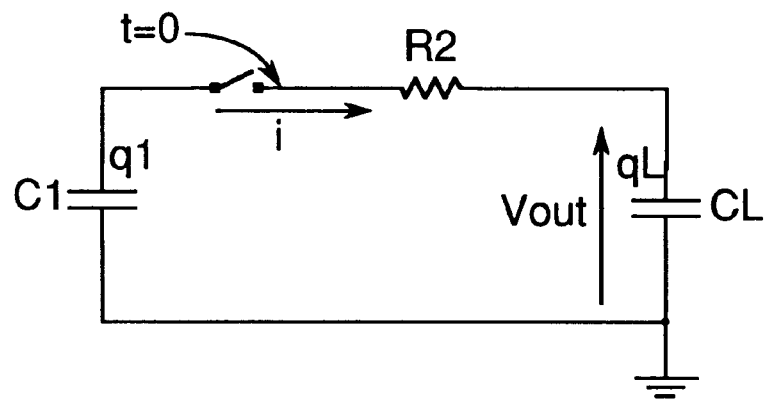
FIG. 8 is an equivalent circuit diagram for operating mode (1) in FIG. 7A.

Initial condition: $q1(0) = C1 \cdot Vdd$ mode (1) is obtained. If the charge current from the power supply is ignored, an equivalent circuit for this operating mode will be as shown in FIG. 8 where R2 is the on resistance of p-channel MOS transistor m2. The following equation can then be derived.

If this equation is solved for Vout, $$V_{out} = \frac{C1}{C1+CL} Vdd \left\{ 1 - \exp\left(-\frac{C1+CL}{R2 \cdot C1 \cdot CL} t\right) \right\} \quad (4)$$

is obtained. The time constant Tr at the rise can thus be obtained from equation 5.

$$\tau r = \frac{R2 \cdot C1 \cdot CL}{C1+CL} \quad (5)$$

Likewise, the time constant Tf at the drop can thus be obtained from equation 6.

$$\tau f = \frac{R3 \cdot C2 \cdot CL}{C2+CL} \quad (6)$$

(where, R3 is the on resistance of p-channel MOS transistor M3)

From these equations it is known that the time constant when charging and discharging the load capacitance CL of the above-noted SCL circuit is C1/(C1+CL) or C2/(C2+CL) times the charge-discharge time constant of a conventional CMOS logic circuit, and by setting C1 and C2 sufficiently large relative to CL, the operating speed can be increased so that it is substantially equal to a conventional CMOS logic circuit.

Power Consumption Evaluation

The energy supplied from the power supply must be calculated to determine the power consumption by the SCL circuit. The above-noted mode (2) is considered here because it is the mode in which energy is supplied from the power supply. The following approximations can also be used to simplify the calculations. When C1 and CL are charged from the power supply, the output follows the potential at the node C in FIG. 7A. Energy consumption by p-channel MOS transistor m2 can therefore be ignored because C1 is adiabatically charged when a potential difference is not applied to p-channel MOS transistor m2.

Figure 9:
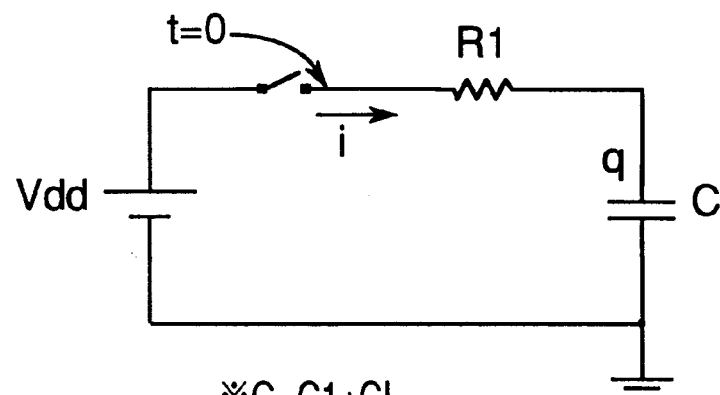
FIG. 9 is an equivalent circuit diagram for operating mode (2) in FIG. 7A.

An equivalent circuit for this operating mode is shown in FIG. 9 assuming these approximations where R1 is the equivalent resistance of p-channel MOS transistor m1. The following equation can then be derived.

$$Vdd = i \cdot R1 + \frac{q}{C} \quad (7)$$

$$i = \frac{dq}{dt}$$

initial condition: $q(0) = C \cdot VH$ (where $C = C1 + CL$)

If this equation is solved for i, then:

$$i = \frac{Vdd - VH}{R1} \exp\left(-\frac{1}{R1 \times C} t\right) \quad (8)$$

As a result, the energy supplied from the power supply is:

$$E = \int_0^\infty Vdd \cdot i \, dt = CL \cdot Vdd^2 \quad (9)$$

and energy consumption is identical to that of a conventional CMOS logic circuit despite the addition of capacitor C1 and capacitor C2.

Applied Example

Figure 10:
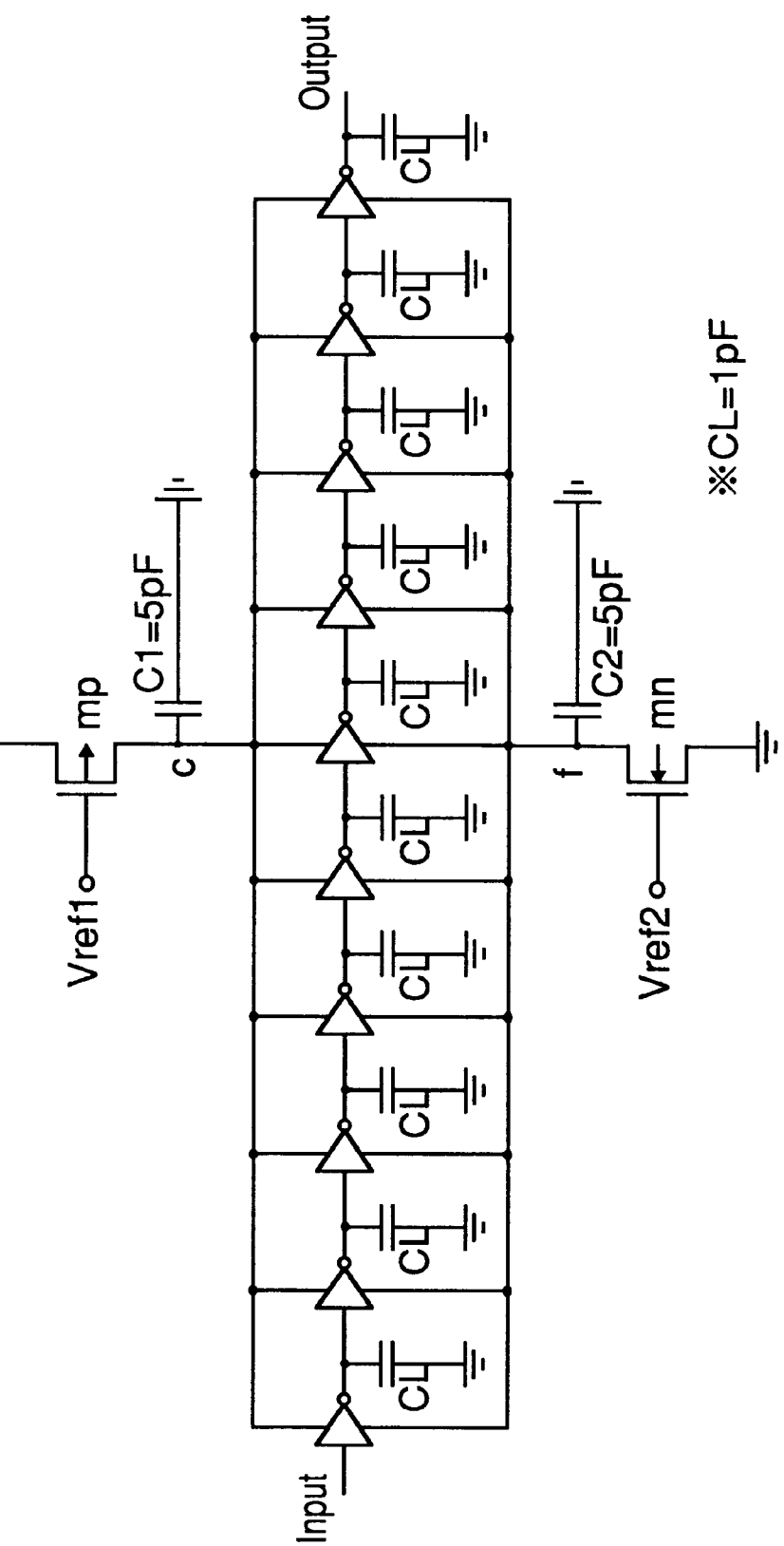
FIG. 10 is a series circuit of ten inverters in which the present invention is applied.

Based on the above results on the power consumption study, we know that it is possible to further reduce power consumption by sharing the capacitors C1 and C2 and transistors for charging and discharging between a number of gates. This is illustrated in FIG. 10. As shown in this example, two capacitors and charging/discharging transistors are shared with ten inverters while a load capacitance CL of 1 pF is connected to the output of each inverter. The power consumption of each element when the circuit was driven at 1 MHz was calculated using a circuit simulation, and the results are compiled in Table 1 below. Power consumption calculated for a conventional CMOS logic circuit of the same size was also obtained and shown for comparison. As will be known from the table, power consumption decreases at each successive stage in the SCL device. The reason for this is described below.

Figure 11B:
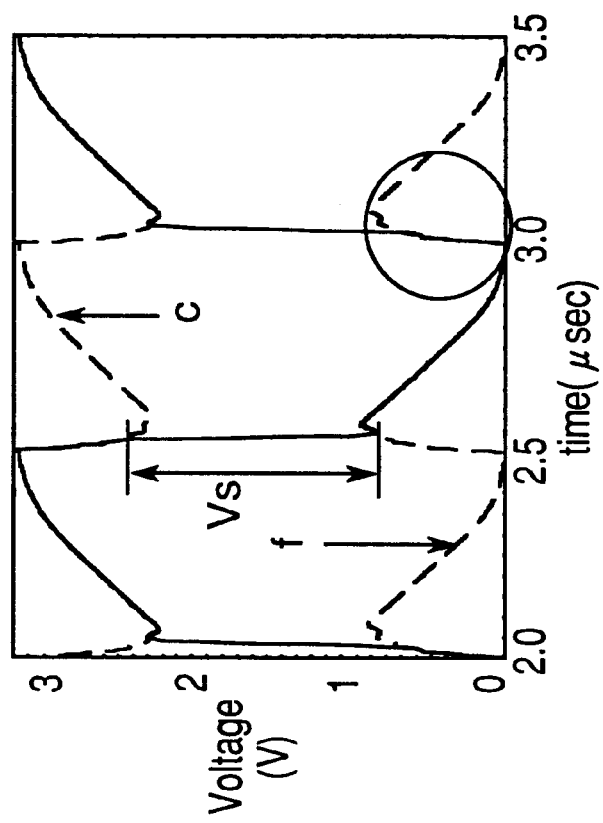
FIG. 11B is an output waveform diagram for stage 9 in FIG. 10.
Figure 11A:
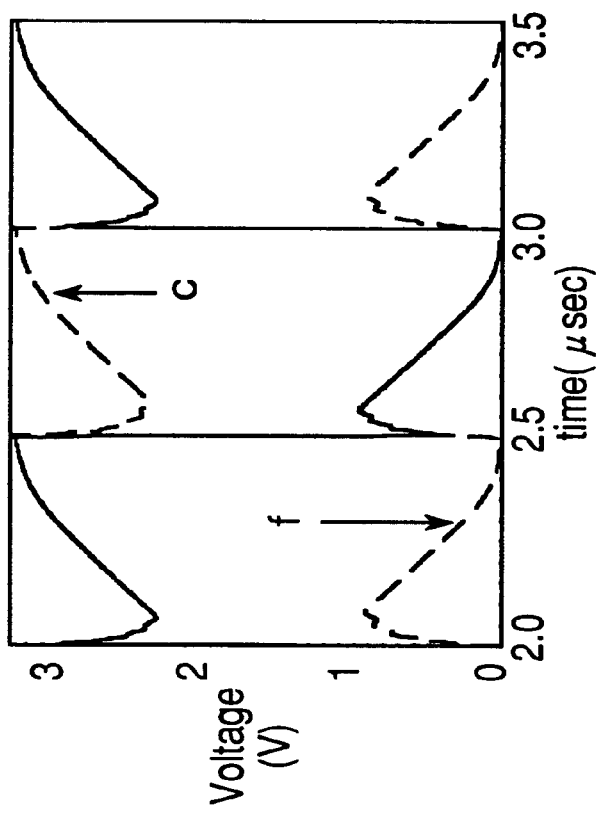
FIG. 11A is an output waveform diagram for stage 1 in FIG. 10.

FIG. 11 compares the output at X1 and X9 (see Table 1). If we look at the area in a circle in FIG. 11 (b) for stage X9, operation through the previous stage results in charge accumulation to capacitor C2 and an increased potential. Because the output of stage X9 follows the potential of node f, the X9 nMOS produces no joule heat due to the principle of adiabatic charging. This is also true when the charge drops. Using the voltage Vs in FIG. 11, energy consumption at stage X9 in an SCL device can be obtained from equation 10.

$$E(X9) = \frac{C_{12} \cdot CL}{C_{12} + CL} \cdot Vs^2 \quad \text{(where } C_{12} = C1 = C2\text{)} \quad (10)$$

Because Vs drops at each later stage, energy consumption also drops. In addition, the lower capacitance C1 and C2, the greater the effect.

TABLE 1

| Element Logic | mp | Mn | X1 | X2 | X3 | X4 | X5 | X6 | X7 | X8 | X9 | X10 | Total |
|---|---|---|---|---|---|---|---|---|---|---|---|---|---|
| CMOS | | | 106.63 | 11.03 | 11.08 | 11.09 | 11.06 | 11.08 | 11.05 | 11.09 | 11.08 | 11.10 | 110.3 |
| SCL | 12.35 | 11.88 | 9.304 | 8.850 | 7.064 | 5.664 | 4.689 | 3.833 | 3.258 | 2.779 | 2.477 | 2.230 | 74.37 |

*Unit: μW
*Xn: inverter at stage n

SCL Performance Evaluation Using a Circuit Simulator

Figure 12A:
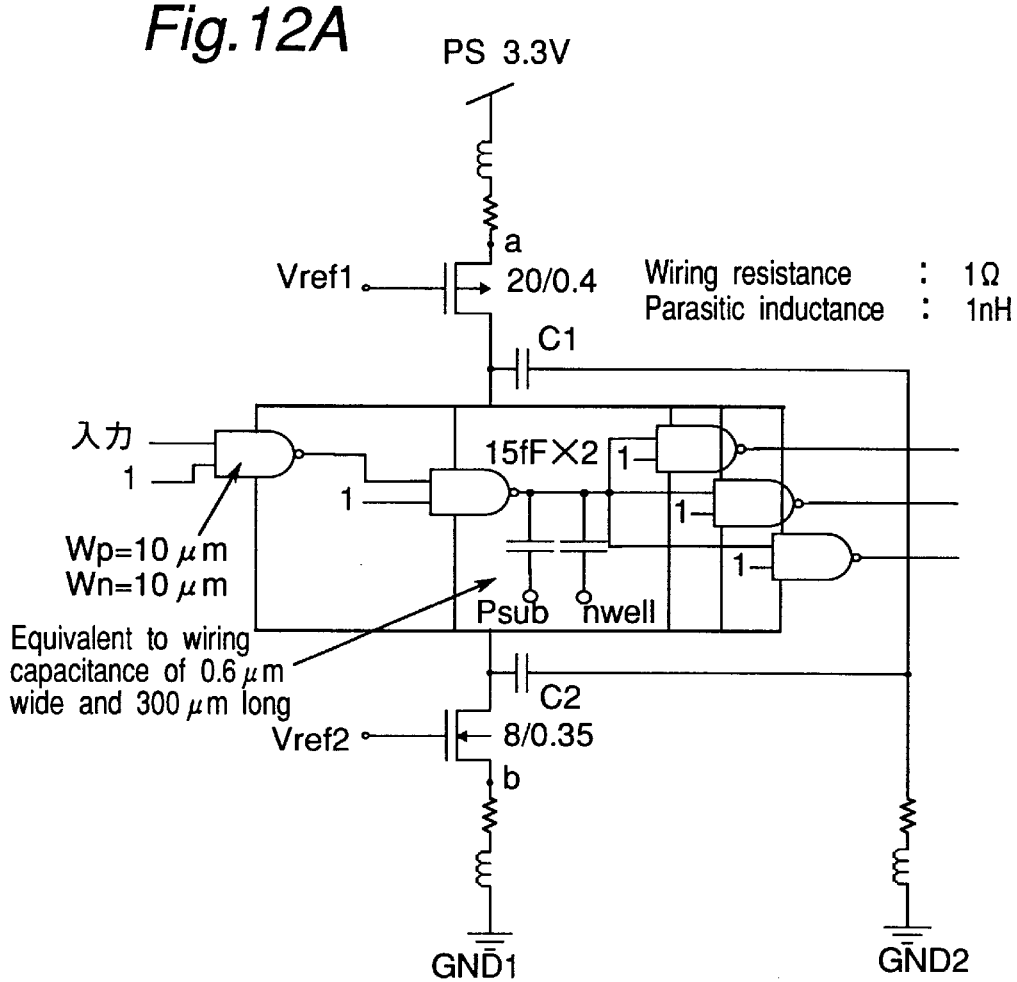
FIG. 12A is a circuit diagram of a 2-input NAND gate with fan-out 3 in the present invention is applied.
Figure 12B:
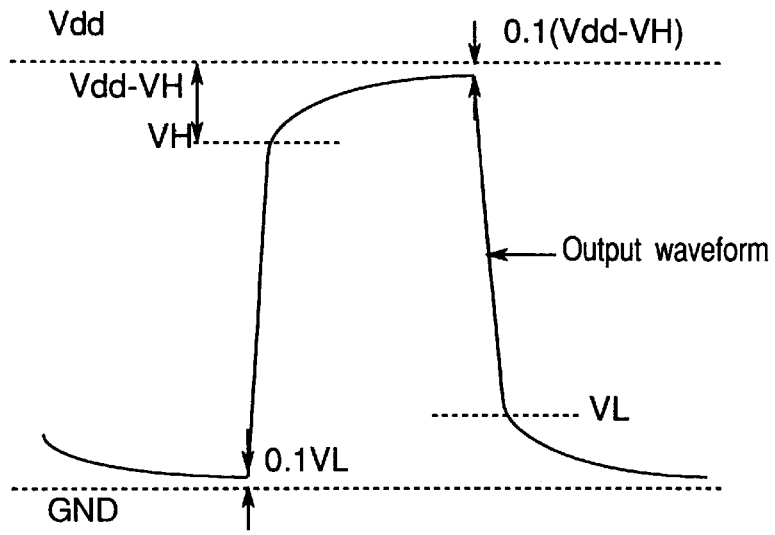
FIG. 12B is a waveform diagram showing the operating conditions for the circuit shown in FIG. 12A.
Figure 13B:
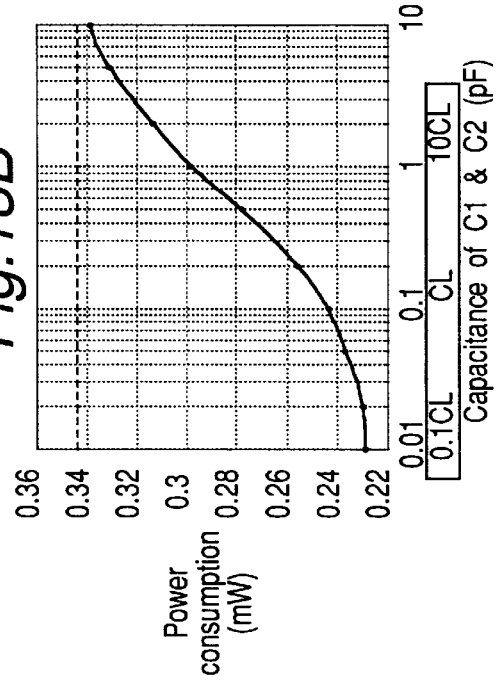
FIGS. 13A–13D show the capacitance dependence of an SCL device, FIG. 13A for noise power, FIG. 13B for power consumption, FIG. 13C for delay time, and FIG. 13D for PD product.
Figure 13A:
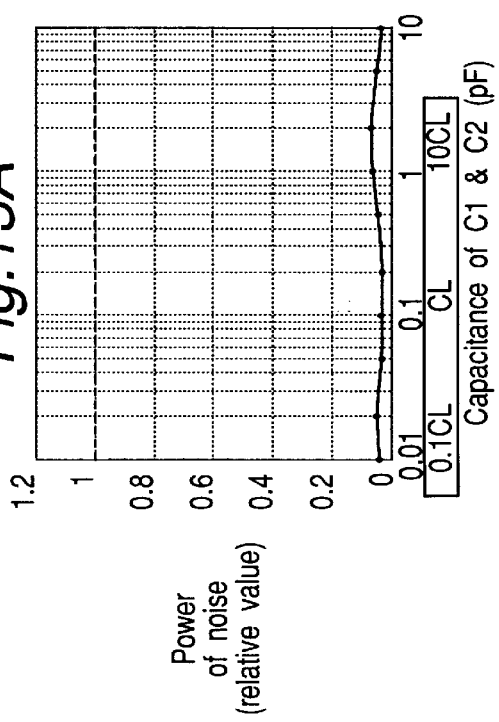
Figure 13D:
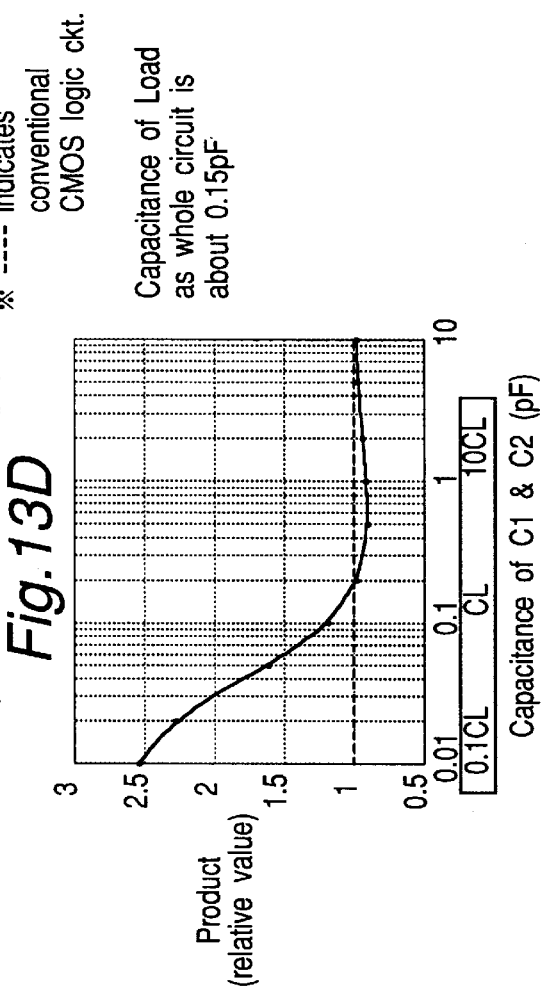
Figure 13C:
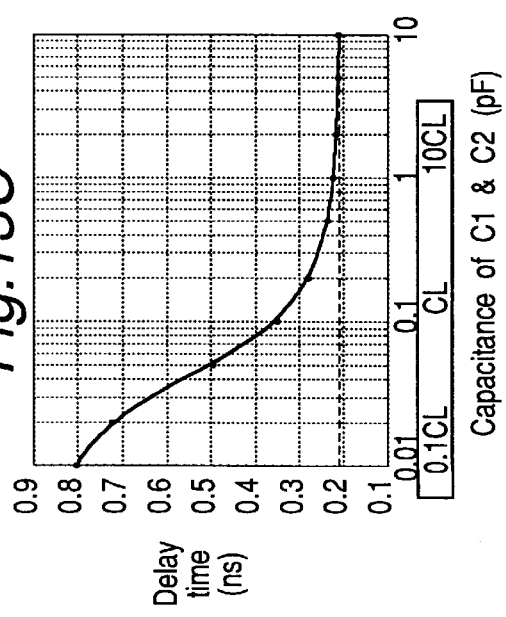
Figure 16B:
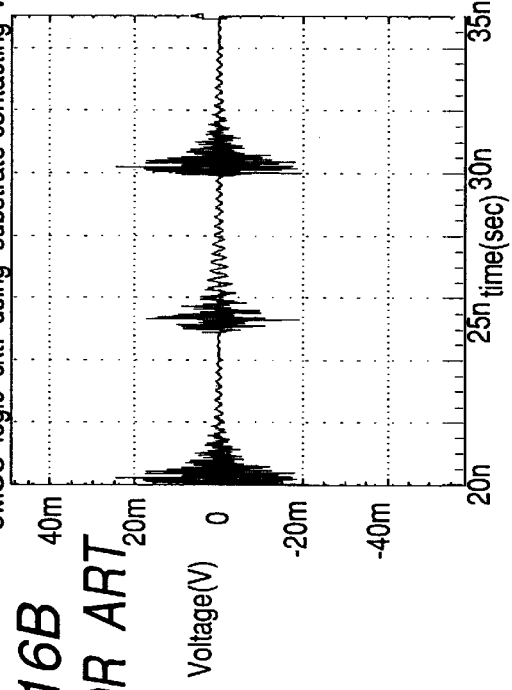
FIGS. 16A–16D compares noise output from various logic circuits as measured with a 2-input NAND gate with fan-out 3 simulation, FIG. 16A showing noise generation in a conventional CMOS logic circuit, FIG. 16B in a CMOS logic circuit having exclusive lines for well and substrate contacts, FIG. 16C in an SCL device, and FIG. 16D in an SCDL device.
Figure 16A:
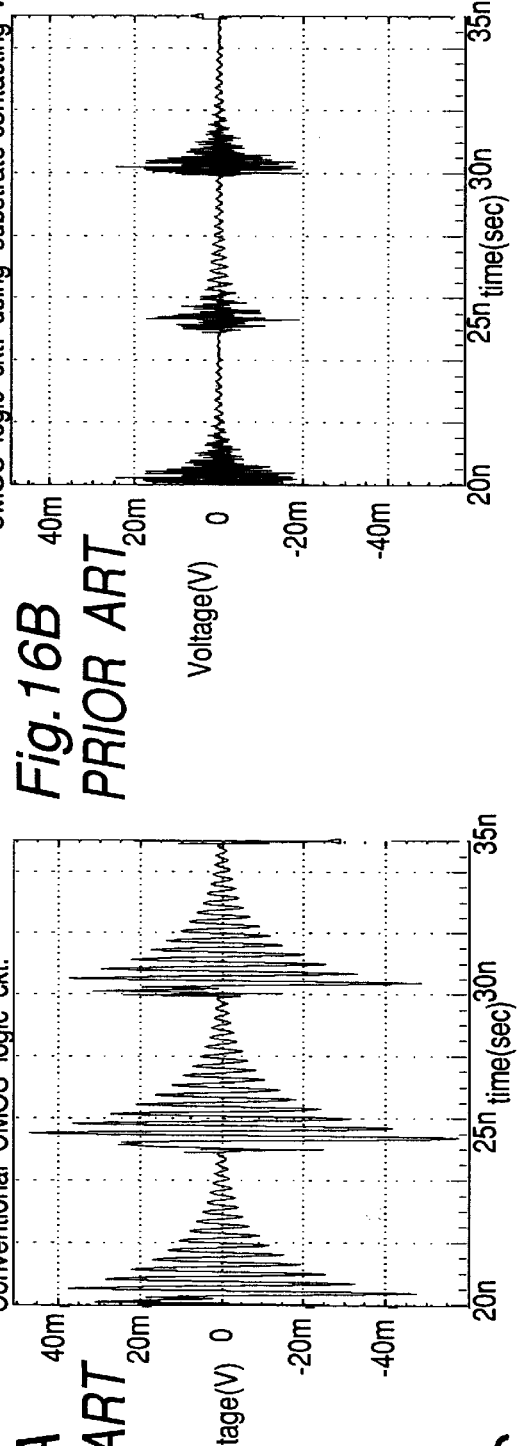
Figure 16D:
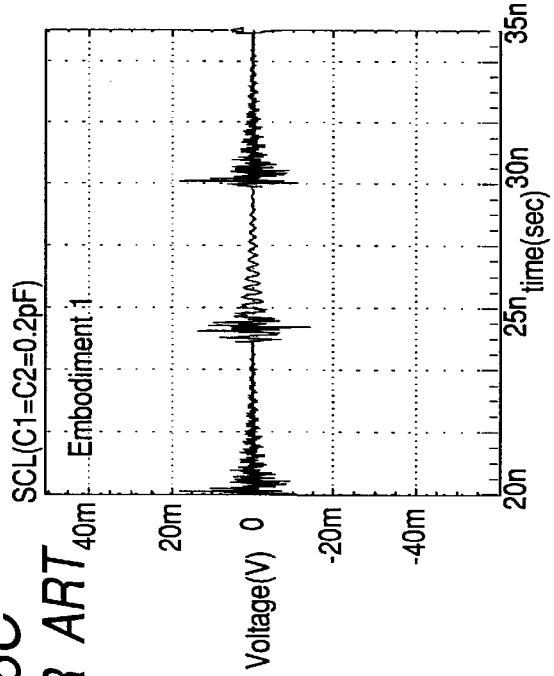
Figure 16C:
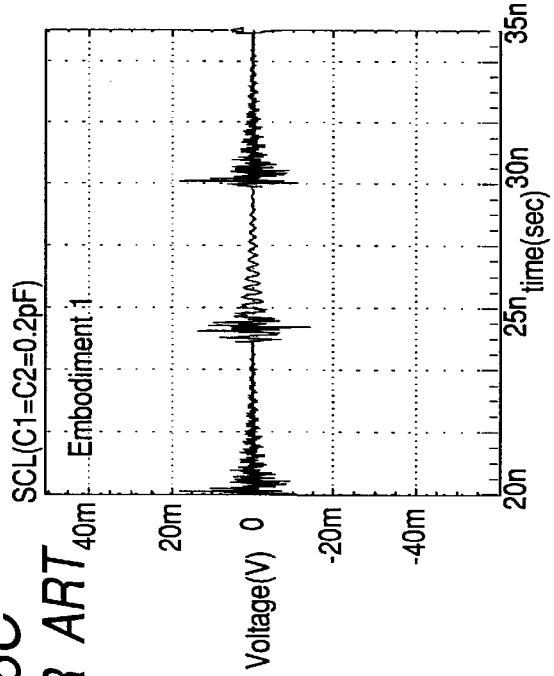

To evaluate the performance of the SCL device, capacitors C1 and C2 were varied using a 2-input NAND gate with fan-out 3 as shown in FIG. 12A, and the results are shown in FIG. 13. To enable a more realistic noise evaluation, a parasitic inductance was added to the wiring resistance both of the power supply and ground, and a wiring capacitance of 15 fF was connected to the p-substrate and n-well (nodes b and a in FIG. 12A) to simulate a 0.6 μm wide, 300 μm long wire. The device was further assumed to be driven at 100 MHz, and the output was dropped or boosted to 10% of VL or Vdd-VH as shown in FIG. 12B. Noise power is substantially constant irrespective of capacitors C1 and C2. That is, the same noise reduction effect can be achieved irrespective of the capacitances C1 and C2. In addition, substantially the same operating characteristics as a conventional CMOS logic circuit can be achieved by increasing capacitances C1 and C2 ten times as large as the load capacitance CL or more. Moreover, while the PD product has a minimum value, the PD product can be reduced compared with a conventional CMOS logic circuit. The substrate waveforms of a conventional CMOS logic circuit and SCL device are shown in FIG. 16A to FIG. 16C. As will be known from the figures, the noise peak is reduced to approximately ⅓, and noise power to less than 1/30 that of a conventional CMOS logic circuit.

SCL Circuit Area

The increase in the size of an SCL device according to the present invention compared with a conventional CMOS logic circuit is controlled by the added capacitors. However, if capacitance C1 and C2 is low relative to the load capacitance CL, the delay time increases as shown in FIG. 13. An increase in circuit size can, however, be reduced by the following two methods.

1. Share the capacitors and charging/discharging transistors with as many logic circuits as possible.
2. In the circuit layout, bury the capacitors below the power supply and ground wires.

By applying these methods, the circuit area of an SCL device according to the present invention can be kept to within 130% of a conventional CMOS logic circuit for the circuit shown in FIG. 12 where C1=C2=0.2 pF. If the operating speed equal to a conventional CMOS logic circuit is desired, a capacitance of several pF is required in the circuit shown in FIG. 12. However, incorporating a capacitance of several pF for gates on this scale in a chip device is an extremely inefficient use of space. The answer in this case is to externally connect the capacitors.

Embodiment 2

Low Switching Noise CMOS Logic Circuit With Diodes: SCDL

In the SCL device, logic amplitude can be reduced, and power consumption and noise can be reduced, by designing capacitors C1 and C2 with a large charge/discharge time constant to drop output before boosting the high level from VH to Vdd, and boost output before dropping a low level from VL to 0 V. However, while this design can be applied to a circuit with a constant switching frequency, it cannot be applied in general. The present invention addresses this problem with a slowly charging with diode logic (SCDL) device wherein the charging/discharging transistors of the first embodiment are replaced by diodes as shown in FIG. 14 to reduce logic amplitude using the voltage threshold drop.

Figure 14:
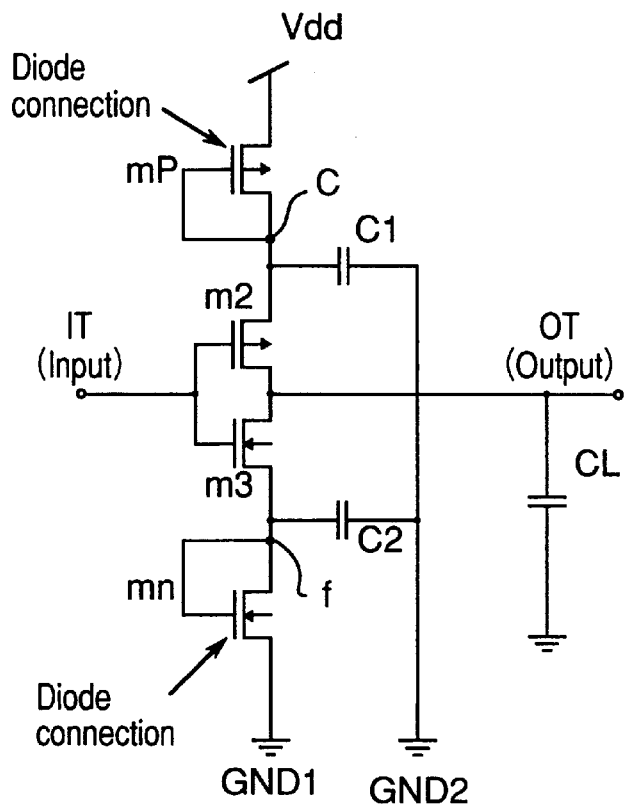
FIG. 14 is a circuit diagram of an SCDL inverter according to the present invention.
Figure 15:
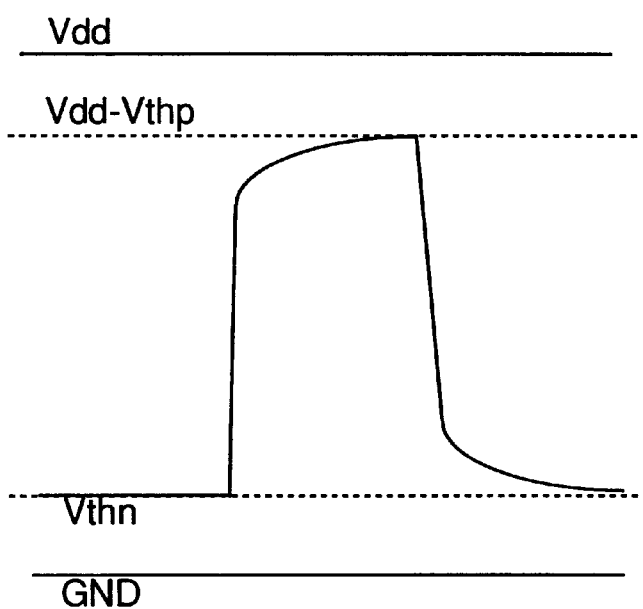
FIG. 15 is an output waveform for the circuit shown in FIG. 14.

As will be known from comparing FIG. 14 and FIG. 5, this second preferred embodiment of the present invention differs from the first embodiment in that a diode connection is used for the charge transistor mp and for the discharge transistor mn.

In addition to being able to reduce the logic amplitude using the voltage threshold drop as noted above, the SCDL circuit according to this preferred embodiment also makes designing for a particular input frequency easier because the variable equivalent resistance of transistors mp and mn can be achieved for potential changes at nodes c and f. A similar calculation can be used to obtain the energy consumption of this circuit as shown in equation 11.

$$E = C_L \cdot Vdd \cdot (Vdd - Vthp - Vthn) \qquad (11)$$

where Vthp and Vthn are the pMOS and nMOS threshold voltages, respectively. The substrate noise of this SCDL device was also simulated using a 2-input NAND gate with fan-out 3 as shown in FIG. 12. The result is shown in FIG. 16D. Note that in this case the noise peak is reduced to approximately ⅕, and noise power to 1/80 that of a conventional CMOS logic circuit.

Comparison of Noise Generation and Performance in Various Logic Circuits

Four logic circuits, that is, a conventional CMOS logic circuit, a CMOS logic circuit with an exclusive line for substrate contact, an SCL device, and an SCDL device, were evaluated and performance compared using a circuit as shown in FIG. 12. The results are shown in Table 2. The SCL and SCDL devices greatly reduce the noise. In a tradeoff with operating speed, the SCDL device in particular achieves an even greater reduction in the noise and power consumption.

TABLE 2

|  | CMOS | CMOS2 | SCL | SCDL |
| --- | --- | --- | --- | --- |
| C1, C2 capacitance (pF) |  |  | 0.2 | 0.2 |
| Power consumption (mW) | 0.3439 | 0.3425 | 0.2559 | 0.1374 |
| Delay time(ns) | 0.210 | 0.210 | 0.279 | 0.508 |
| PD product (relative) | 1 | 0.991 | 0.989 | 0.966 |
| Peak noise value(relative) | 1 | 0.46 | 0.28 | 0.18 |
| Noise power (relative) | 1 | 0.0699 | 0.0300 | 0.0125 |

*: CMOS2 indicates a CMOS logic circuit with exclusive for substrate-contacts.

Embodiment 3

The first and second embodiments of the present invention have been described above with reference to a capacitor and charge/discharge transistor or diode disposed on both the power supply and ground sides. It is also possible as described below, however, to reduce switching noise by providing a capacitor and charge or discharge transistor (or diode) on only the power supply side or the ground side.

Version 1

Figure 17:
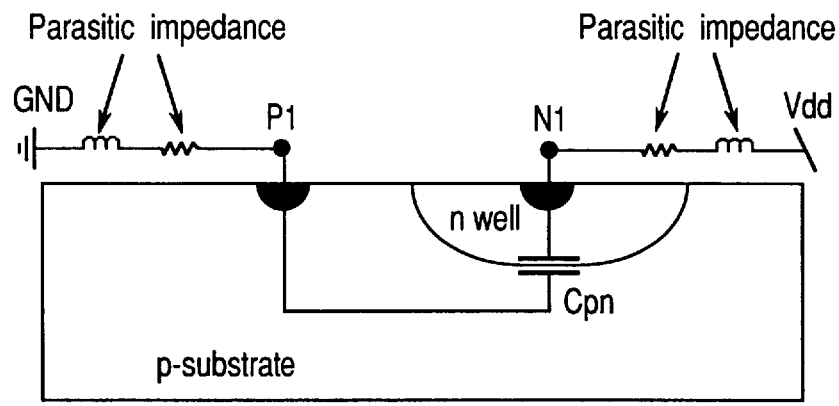
FIG. 17 is an equivalent circuit model of a n-well p-substrate structure.
Figure 18:
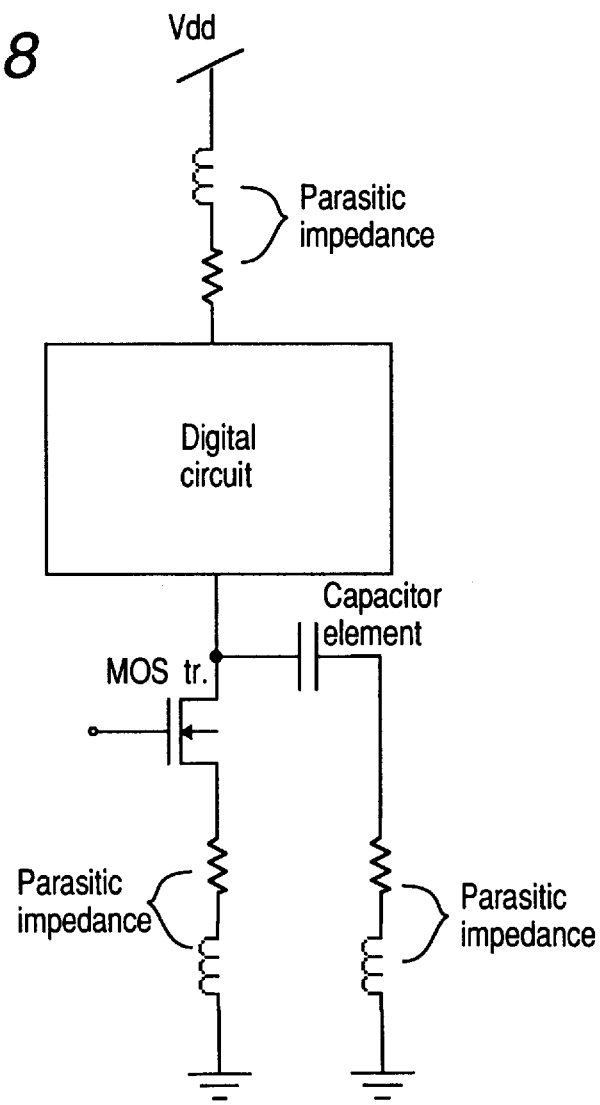
FIG. 18 is a circuit diagram of an SCL device according to a first version of the third embodiment of the present invention.

When the added capacitive element and MOS transistor of the SCL device have a p-substrate, n-well design, noise can be suppressed by connection to the ground side only. An equivalent circuit model for a p-substrate, n-well design is as shown in FIG. 17 if the resistance component in the substrate is ignored. In this model, noise inserted from P1 propagates through the p-substrate. Substrate noise can therefore be suppressed as shown in FIG. 18 by thus connecting the added capacitive element and MOS transistor to the ground side only.

Figure 19A:
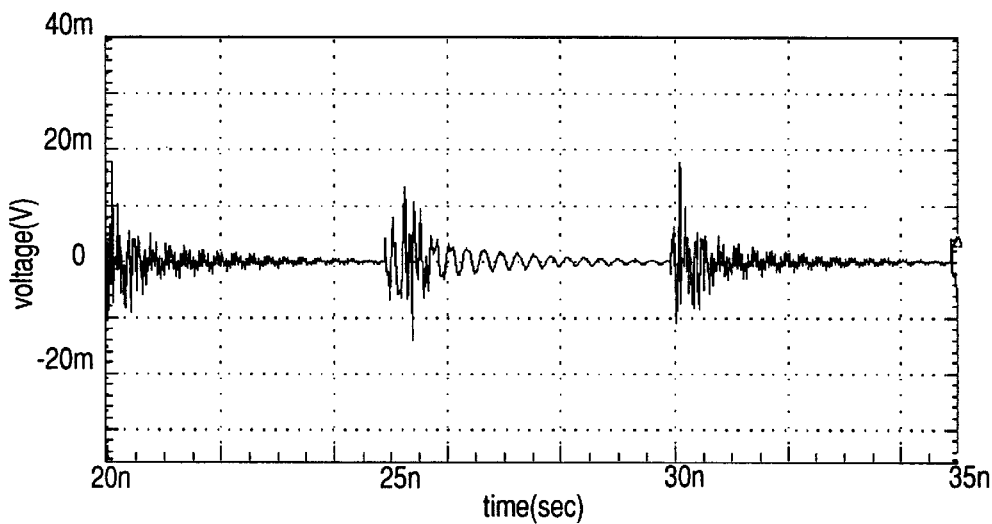
FIG. 19A shows a noise generation in the SCL device of FIG. 18 with an added capacitive element and MOS transistor connected to both power supply and ground sides (according to the first embodiment of the invention)
Figure 19B:
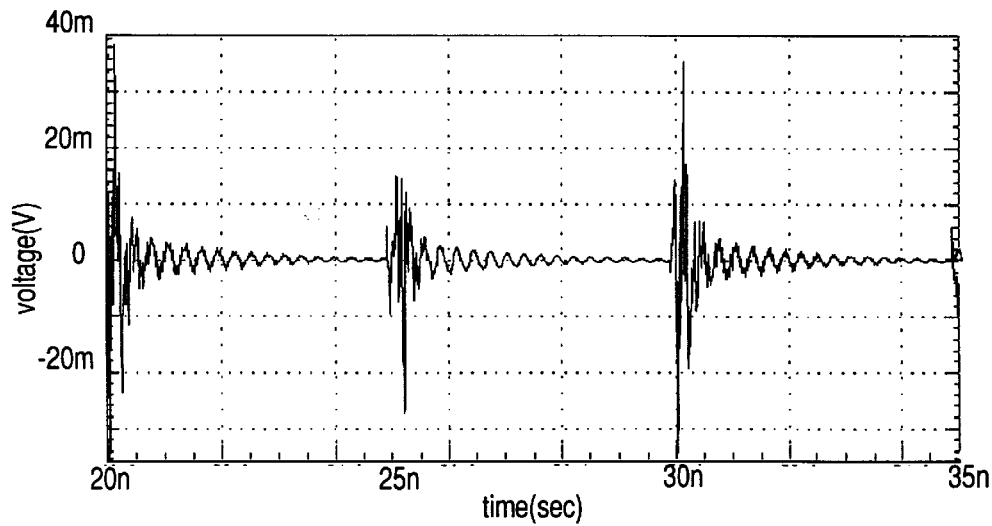
FIG. 19B shows a noise generation in the SCL device of FIG. 18 with an added capacitive element and MOS transistor connected to only the ground side (according to the first version of the third embodiment of the invention)

However, noise occurring at node N1 in FIG. 17 on the power source side leaks to the p-substrate because of the coupling of pn coupling capacitance Cpn. As a result, the substrate noise suppression effect of this design is less than when an added capacitive element and MOS transistor are added to both power supply and ground sides. This is shown in a circuit simulation using a 2-input NAND gate with fan-out 3 where 1 pF was connected as a pn coupling capacitance. Substrate noise waves obtained when an added capacitive element and MOS transistor were added to both power supply and ground sides, and to the ground side only, are shown in FIG. 19 (*a*) and (*b*), respectively. Even when connected only to the ground side, the noise peak can be reduced to approximately 5/6, and noise power to approximately 7/90, those of a conventional CMOS logic circuit.

Version 2

Figure 20:
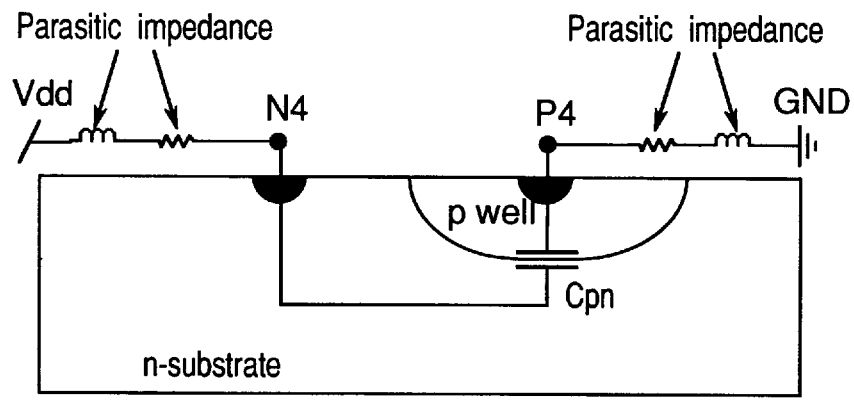
FIG. 20 is an equivalent circuit model in a p-well n-substrate structure.
Figure 21:
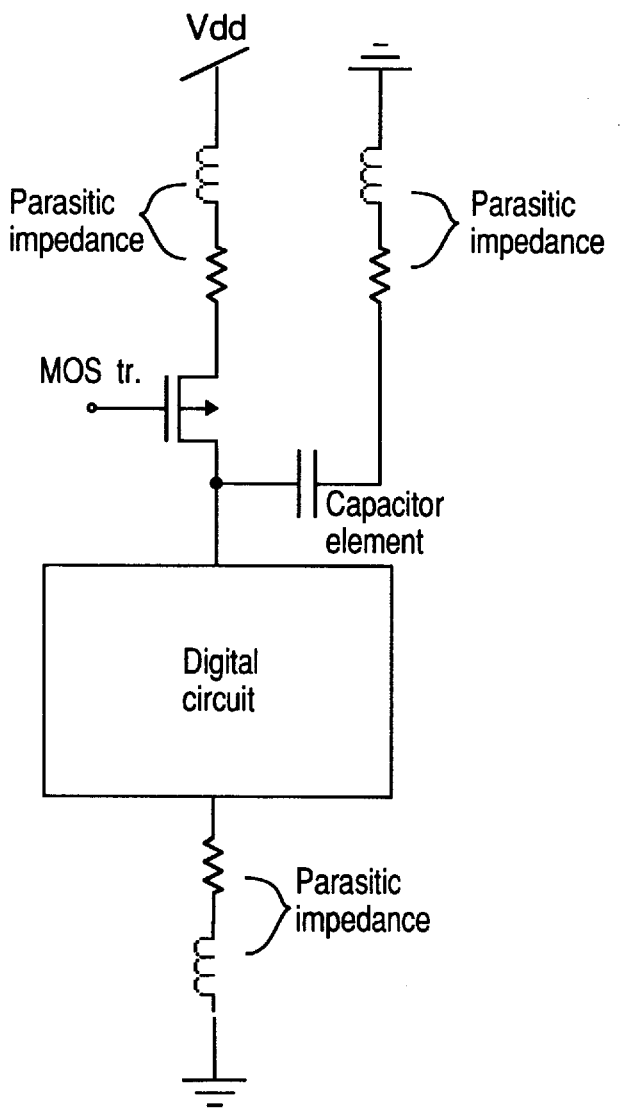
FIG. 21 is a circuit diagram of an SCL device according to a second version of the third embodiment of the present invention.

When the added capacitive element and MOS transistor of the SCL device have an n-substrate, p-well design, noise can be suppressed by connection to the power supply side only. An equivalent circuit model for an n-substrate, p-well design is as shown in FIG. 20 if the resistance component in the substrate is ignored. In this model, noise inserted from N4 propagates through the n-substrate. Substrate noise can therefore be suppressed as shown in FIG. 21 by thus connecting the added capacitive element and MOS transistor to the power supply side only.

Figure 22A:
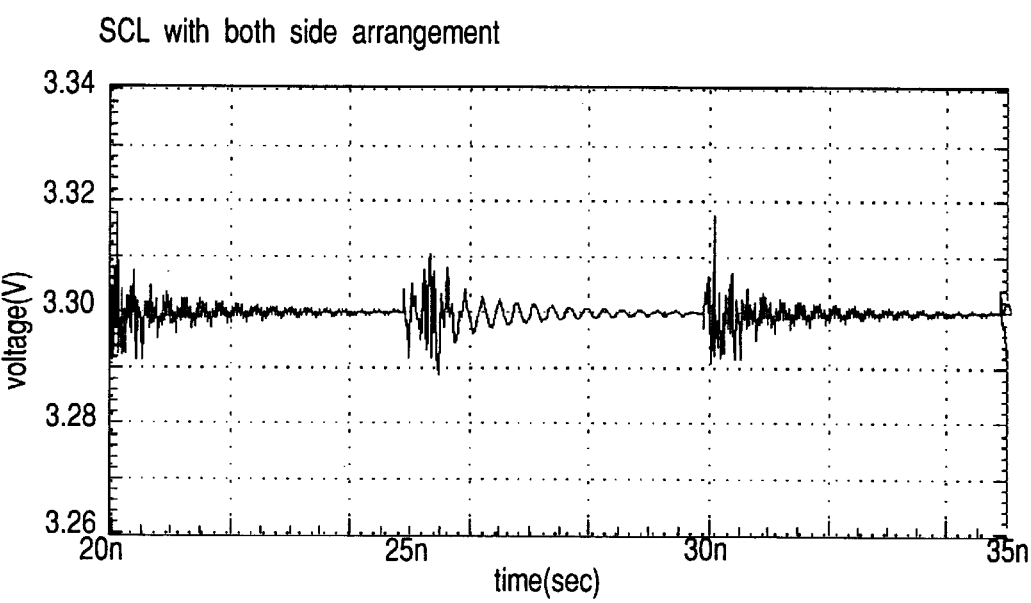
FIG. 22A shows a noise generation in the SCL device of FIG. 21 with an added capacitive element and MOS transistor connected to both power supply and ground sides (according to the first embodiment of the invention)
Figure 22B:
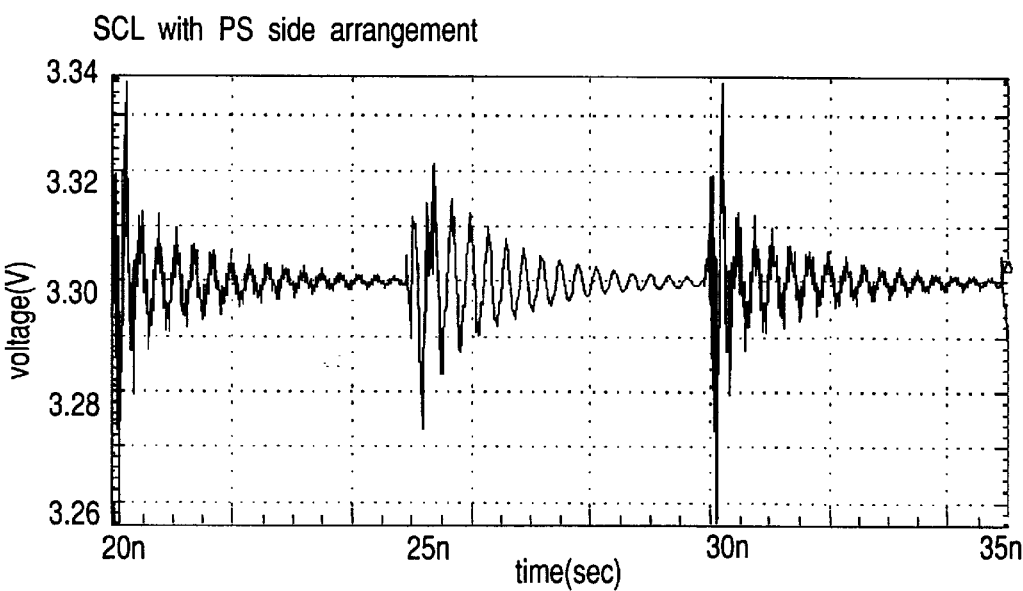
FIG. 22B shows a noise generation in the SCL device of FIG. 21 with an added capacitive element and MOS transistor connected to only the power supply side (according to the second version of the third embodiment of the invention)

However, noise occurring at node P4 in FIG. 20 on the ground side leaks to the n-substrate because of the coupling of pn coupling capacitance Cpn. As a result, the substrate noise suppression effect of this design is less than when an added capacitive element and MOS transistor are added to both power supply and ground sides. This is shown in a circuit simulation using a 2-input NAND gate with fan-out 3 where 1 pF was connected as a pn coupling capacitance. Substrate noise waves obtained when an added capacitive element and MOS transistor were added to both power supply and ground sides, and to the power supply side only, are shown in FIGS. 22A and 22B, respectively. Even when connected only to the power supply side, noise power can be reduced to approximately 1/5 that of a conventional CMOS logic circuit, although the noise peak cannot be reduced.

Version 3

Figure 23:
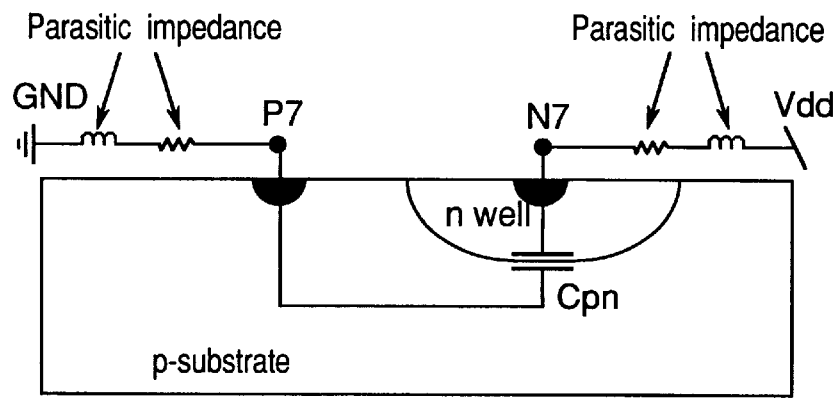
FIG. 23 is an equivalent circuit model in a n-well p-substrate structure.
Figure 24:
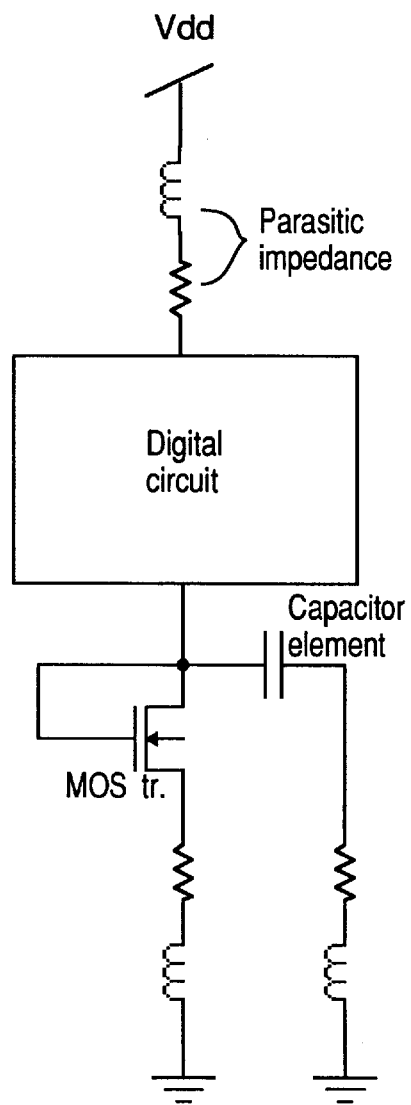
FIG. 24 is a circuit diagram of an SCDL device according to a third version of the third embodiment of the present invention.

When the added capacitive element and MOS transistor of an SCDL device have a p-substrate, n-well design, noise can be suppressed by connection to the ground side only. An equivalent circuit model for a p-substrate, n-well design is as shown in FIG. 23 if the resistance component in the substrate is ignored. In this model, noise inserted from P7 propagates through the p-substrate. Substrate noise can therefore be suppressed as shown in FIG. 24 by thus connecting the added capacitive element and MOS transistor to the ground side only.

Figure 25A:
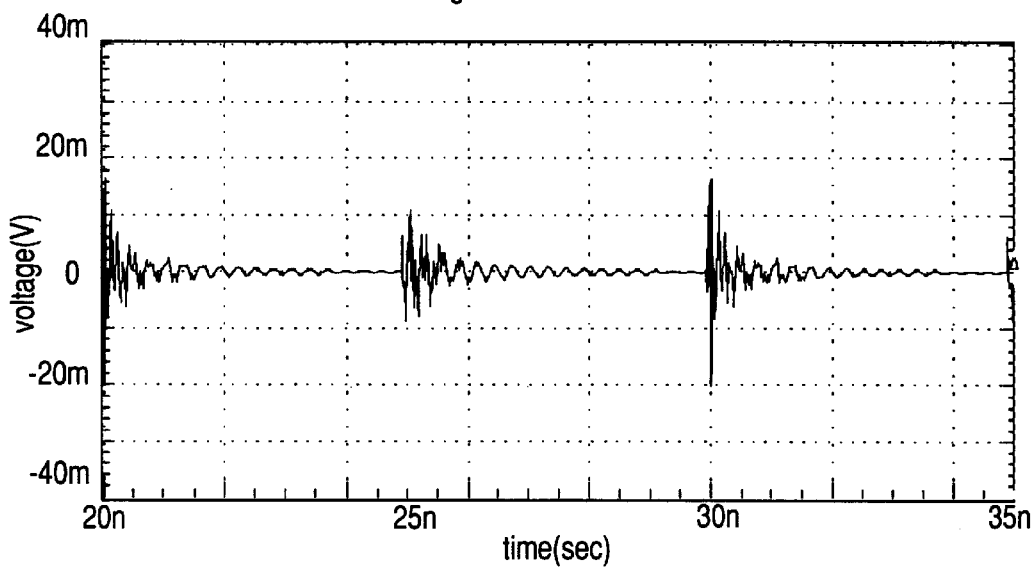
FIG. 25A shows a noise generation in the SCDL device of FIG. 24 with an added capacitive element and MOS transistor connected to both power supply and ground sides (according to the second embodiment of the invention)
Figure 25B:
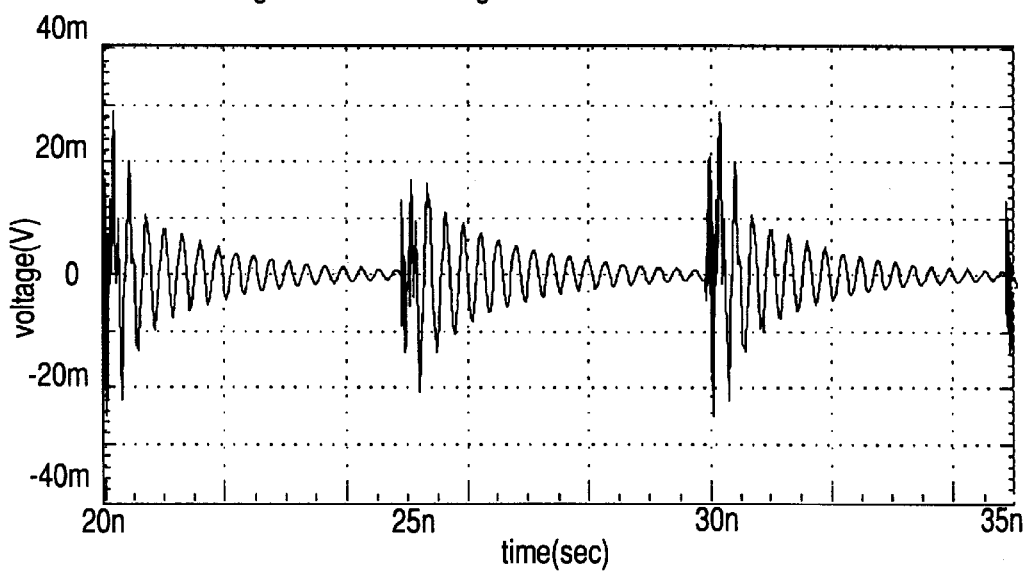
FIG. 25B shows a noise generation in the SCDL device of FIG. 24 with an added capacitive element and MOS transistor connected to only the ground side (according to the third version of the third embodiment of the invention)

However, noise occurring at node N7 in FIG. 23 on the power supply side leaks to the p-substrate because of the coupling of pn coupling capacitance Cpn. As a result, the substrate noise suppression effect of this design is less than when an added capacitive element and MOS transistor are added to both power supply and ground sides. This is shown in a circuit simulation using 2-input NAND gate with fan-out 3 where 1 pF was connected as a pn coupling capacitance. Substrate noise waves obtained when an added capacitive element and MOS transistor were added to both power supply and ground sides, and to the ground side only, are shown in FIG. 25 (*a*) and (*b*), respectively. Even when connected only to the ground side, the noise peak can be reduced to approximately 3/5, and noise power to approximately 1/8, those of a conventional CMOS logic circuit.

Version 4

Figure 26:
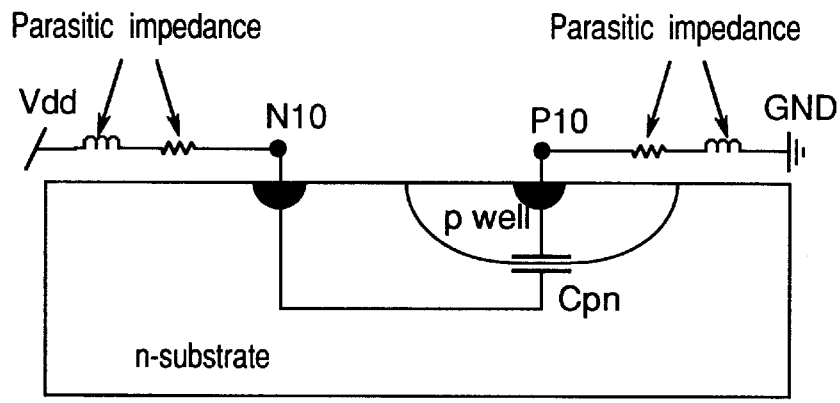
FIG. 26 is an equivalent circuit model in a p-well n-substrate structure.
Figure 27:
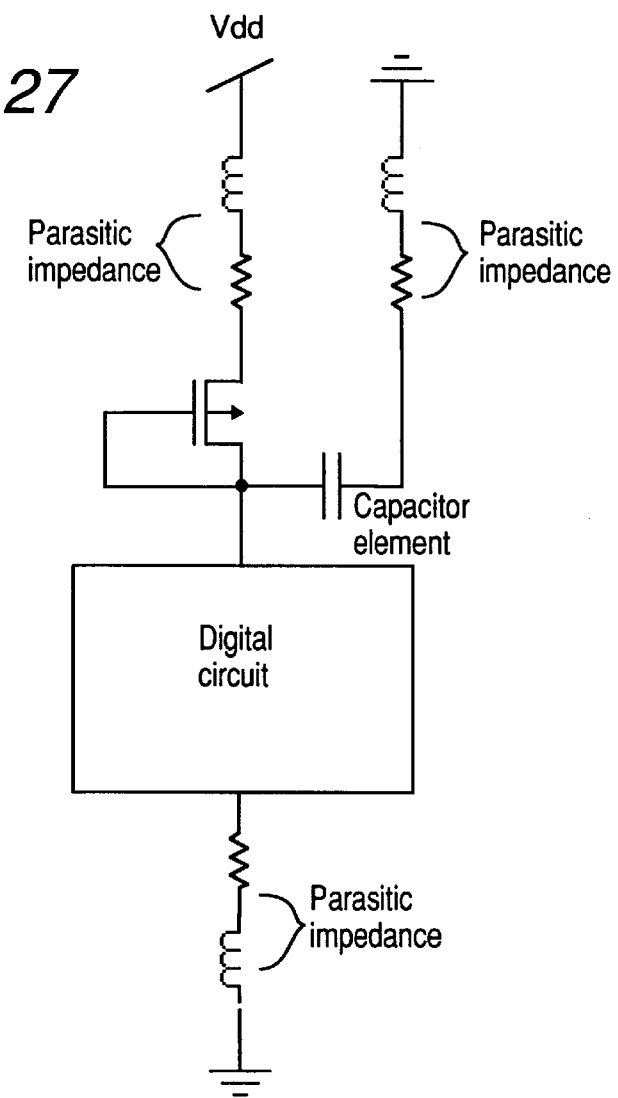
FIG. 27 is a circuit diagram of an SCDL device according to a fourth version of the third embodiment of the present invention.

When the added capacitive element and MOS transistor of the SCDL device have an n-substrate, p-well design, noise can be suppressed by connection to the power supply side only. An equivalent circuit model for an n-substrate, p-well design is as shown in FIG. 26 if the resistance component in the substrate is ignored. In this model, noise inserted from N10 propagates through the n-substrate. Substrate noise can therefore be suppressed as shown in FIG. 27 by thus connecting the added capacitive element and MOS transistor to the power supply side only.

Figure 28A:
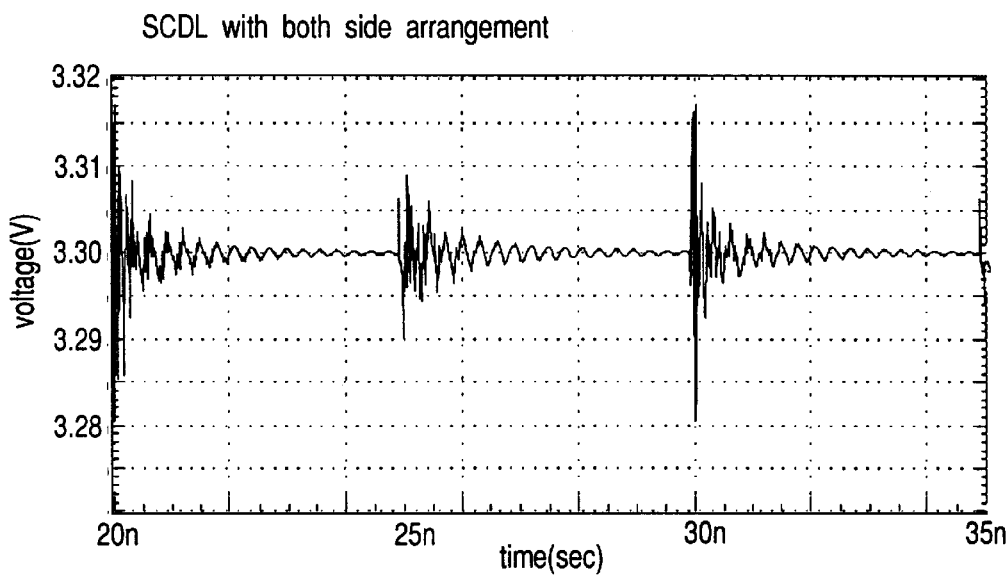
FIG. 28A shows a noise generation in the SCDL device of FIG. 27 with an added capacitive element and MOS transistor connected to both power supply and ground sides (according to the second embodiment of the invention)
Figure 28B:
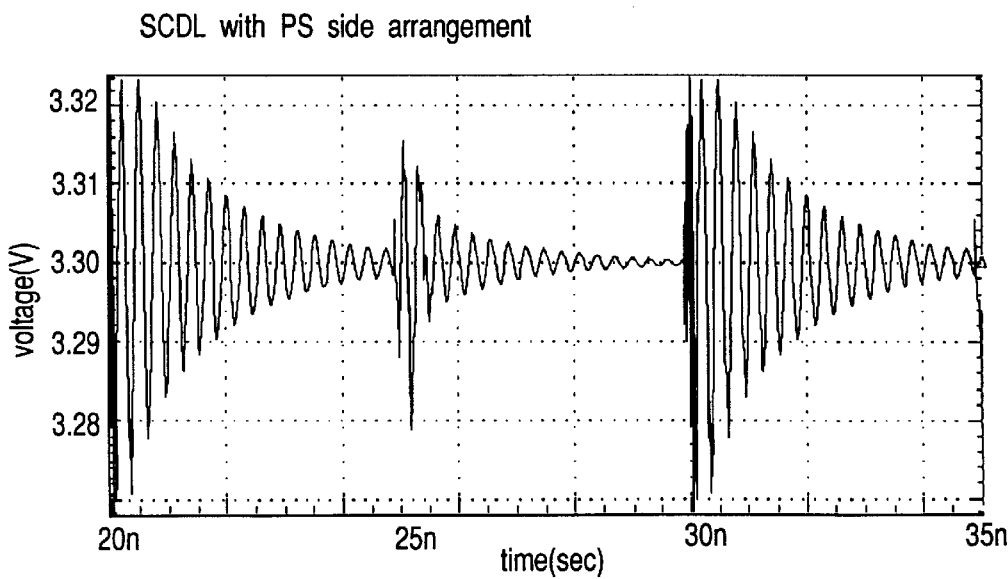
FIG. 28B shows a noise generation in the SCDL device of FIG. 27 with an added capacitive element and MOS transistor connected to only the power supply side (according to the fourth version of the third embodiment of the invention).

However, noise occurring at node P10 in FIG. 26 on the ground side leaks to the n-substrate because of the coupling of pn coupling capacitance Cpn. As a result, the substrate noise suppression effect of this design is less than when an added capacitive element and MOS transistor are added to both power supply and ground sides. This is shown in a circuit simulation using a 2-input NAND gate with fan-out 3 where 1 pF was connected as a pn coupling capacitance. Substrate noise waves obtained when an added capacitive element and MOS transistor were added to both power supply and ground sides, and to the power supply side only, are shown in FIGS. 28A and 28B, respectively. Even when connected only to the power supply side, the noise peak can be reduced to approximately 3/10, and noise power can be reduced to approximately 3/20 that of a conventional CMOS logic circuit.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A low switching noise logic circuit comprising:

a capacitive element added to a power source side and/or a ground side of a CMOS logic circuit; and a resistive element connected between the capacitive element and terminal on the side to which the capacitive element is added;

wherein a time constant determined by the capacitive element and resistive element is sufficiently greater than a time constant determined by a capacity and resistance of the CMOS logic circuit.

2. The low switching noise logic circuit according to claim 1, wherein a capacitive element and resistive element are provided on a power supply side and ground side.

3. The low switching noise logic circuit according to claim 1, wherein the capacitive element has a capacitance larger than the load capacitance of the CMOS logic circuit.

4. The low switching noise logic circuit according to claim 1, wherein the resistive element is a MOS transistor of which the gate is connected to the drain.

5. The low switching noise logic circuit according to claim 1, wherein the resistive element is the resistance component of the transistor.

6. The low switching noise logic circuit according to claim 1, wherein the resistive element is a resistor.

7. An analog-digital hybrid IC device having a CMOS logic circuit and analog circuit formed on a same substrate, said device comprising:

a capacitive element added to a power supply side and/or a ground side of a CMOS logic circuit; and a resistive element is connected between the capacitive element and terminal on the side to which the capacitive element is added;

wherein a time constant determined by the capacitive element and resistive element is sufficiently greater than a time constant determined by a load capacity and on resistance of a transistor in the CMOS logic circuit.

8. The analog-digital hybrid IC device according to claim 7, wherein a capacitive element and resistive element are provided on a power supply side and ground side.

9. The analog-digital hybrid IC device according to claim 7, wherein the capacitive element has a capacitance larger than the load capacitance of the CMOS logic circuit.

10. The analog-digital hybrid IC device according to claim 7, wherein the resistive element is a MOS transistor of which the gate is connected to the drain.

11. The analog-digital hybrid IC device according to claim 7, wherein the resistive element is the resistance component of the transistor.

12. The analog-digital hybrid IC device according to claim 7, wherein the resistive element is a resistor.

* * * * *